US005922512A

United States Patent [19]

DoMinh

[11] Patent Number: 5,922,512

[45] Date of Patent: *Jul. 13, 1999

[54] PROCESSLESS DIRECT WRITE PRINTING PLATE HAVING HEAT SENSITIVE POLYMER AND METHODS OF IMAGING AND PRINTING

[75] Inventor: Thap DoMinh, Rochester, N.Y.

[73] Assignee: Kodak Polychrome Graphics LLC, Norwalk, Conn.

[ * ] Notice: This patent issued on a continued prosecution application filed under 37 CFR 1.53(d), and is subject to the twenty year patent term provisions of 35 U.S.C. 154(a)(2).

[21] Appl. No.: 09/119,576

[22] Filed: Jul. 20, 1998

Related U.S. Application Data

[63] Continuation-in-part of application No. 09/015,281, Jan. 29, 1998., abandoned

[51] Int. Cl.[6] .............................. G03F 7/26; G03F 7/032

[52] U.S. Cl. .......................... 430/302; 101/451; 101/456; 101/462; 101/465

[58] Field of Search ............................. 430/270.1, 286.1, 430/287.1, 302; 101/451, 456, 462, 465, 457

[56] References Cited

U.S. PATENT DOCUMENTS

| | | | |
|---|---|---|---|
| 3,615,559 | 10/1971 | Kaspaul et al. | 96/88 |
| 3,645,733 | 2/1972 | Brinckman et al. | 430/325 |
| 3,905,816 | 9/1975 | Boardman et al. | 96/33 |
| 3,907,564 | 9/1975 | Boardman et al. | 96/33 |
| 3,929,481 | 12/1975 | Kubotera et al. | 430/205 |
| 4,081,572 | 3/1978 | Pacansky | 427/53 |
| 4,115,613 | 9/1978 | Inoue et al. | 430/270.1 |
| 4,508,814 | 4/1985 | Sakurai et al. | 430/303 |
| 4,555,475 | 11/1985 | Gamson et al. | 430/309 |
| 4,634,659 | 1/1987 | Esumi et al. | 430/302 |
| 4,693,958 | 9/1987 | Schwatrz et al. | 430/302 |
| 4,965,322 | 10/1990 | Shimamura et al. | 525/332.6 |
| 5,102,771 | 4/1992 | Vogel et al. | 430/270 |
| 5,725,994 | 3/1998 | Kondo | 430/270.1 |
| 5,766,574 | 6/1998 | Christina-Beck et al. | 424/53 |

FOREIGN PATENT DOCUMENTS

| | | |
|---|---|---|
| 0652483A1 | 5/1995 | European Pat. Off. . |
| 62-164049 | 1/1986 | Japan . |

*Primary Examiner*—Janet Baxter
*Assistant Examiner*—Sin J. Lee
*Attorney, Agent, or Firm*—Ratner & Prestia

[57] ABSTRACT

An imaging member, such as a negative-working printing plate, can be prepared using a heat sensitive imaging layer comprised of a heat-sensitive vinyl polymer and optionally a photothermal conversion material. The heat-sensitive polymer has recurring units containing a cyclic anhydride that decarboxylates upon application of thermal energy (such as from IR irradiation), rendering the polymer more hydrophobic in IR exposed areas. Upon contact with a neutral or acidic pH solution, the polymer is then rendered more hydrophilic in unexposed areas.

30 Claims, No Drawings

PROCESSLESS DIRECT WRITE PRINTING PLATE HAVING HEAT SENSITIVE POLYMER AND METHODS OF IMAGING AND PRINTING

CROSS-REFERENCE TO RELATED APPLICATIONS

This application is a continuation-in-part of Ser. No. 09/015,281, filed Jan. 29, 1998, now abandoned.

FIELD OF THE INVENTION

This invention relates in general to lithographic imaging members, and particularly to lithographic printing plates. The invention also relates to a method of digital imaging such imaging members, and to a method of printing using them.

BACKGROUND OF THE INVENTION

The art of lithographic printing is based upon the immiscibility of oil and water, wherein an oily material or ink is preferentially retained by an imaged area and the water or fountain solution is preferentially retained by the non-imaged areas. When a suitably prepared surface is moistened with water and an ink is then applied, the background or non-imaged areas retain the water and repel the ink while the imaged areas accept the ink and repel the water. The ink is eventually transferred to the surface of a suitable substrate, such as cloth, paper or metal, thereby reproducing the image.

Very common lithographic printing plates include a metal or polymer support having thereon an imaging layer sensitive to visible or UV light. Both positive- and negative-working printing plates can be prepared in this fashion. Upon exposure, and perhaps post-exposure heating, either imaged or non-imaged areas are removed using wet processing chemistries.

Thermally sensitive printing plates are less common. Examples of such plates are described in U.S. Pat. No. 5,372,915 (Haley et al). They include an imaging layer comprising a mixture of dissolvable polymers and an infrared radiation absorbing compound. While these plates can be imaged using lasers and digital information, they require wet processing using alkaline developer solutions.

Dry planography, or waterless printing, is well known in the art of lithographic offset printing and provides several advantages over conventional offset printing. Dry planography is particularly advantageous for short run and on-press applications. It simplifies press design by eliminating the fountain solution and aqueous delivery train. Careful ink water balance is unnecessary, thus reducing rollup time and material waste. Silicone rubbers [such as poly (dimethylsiloxane) and other derivatives of poly(siloxanes)] have long been recognized as preferred waterless-ink repelling materials.

It has been recognized that a lithographic printing plate could be created containing an IR absorbing layer. Canadian 1,050,805 (Eames) discloses a dry planographic printing plate comprising an ink receptive substrate, an overlying silicone rubber layer, and an interposed layer comprised of laser energy absorbing particles (such as carbon particles) in a self-oxidizing binder (such as nitrocellulose) and an optional cross-linkable resin. Such plates were exposed to focused near IR radiation with a $Nd^{++}$YAG laser. The absorbing layer converted the infrared energy to heat thus partially loosening, vaporizing or ablating the absorber layer and the overlying silicone rubber. The plate was developed by applying naphtha solvent to remove debris from the exposed image areas. Similar plates are described in *Research Disclosure* 19201, 1980 as having vacuum-evaporated metal layers to absorb laser radiation in order to facilitate the removal of a silicone rubber overcoated layer. These plates were developed by wetting with hexane and rubbing. $CO_2$ lasers are described for ablation of silicone layers by Nechiporenko & Markova, PrePrint 15th International IARIGAI Conference, June, 1979, Lillehammer, Norway, Pira Abstract 02-79-02834. Typically, such printing plates require at least two layers on a support, one or more being formed of ablatable materials.

While the noted printing plates used for digital, processless printing have a number of advantages over the more conventional photosensitive printing plates, there are a number of disadvantages with their use. The process of ablation creates debris and vaporized materials that must be collected. The laser power required for ablation can be considerably high, and the components of such printing plates may be expensive, difficult to coat, or unacceptable in resulting printing quality. Typically, such printing plates require at least two layers on a support, one or more being formed of ablatable materials.

Some thermally switchable polymers have been described for use as imaging materials in printing plates. By "switchable" is meant that the polymer is irreversibly rendered either more hydrophobic or hydrophilic upon exposure to heat.

As an alternative method of preparing printing plates, U.S. Pat. No. 4,634,659 (Esumi et al) describes imagewise irradiating hydrophobic polymer coatings to render exposed regions more hydrophilic in nature. While this concept was one of the early applications of converting surface characteristics in printing plates, it has the disadvantages of requiring long UV light exposure times (up to 60 minutes), and the plate's use is in a positive-working mode only.

JP Kokai 95-023030 describes a printing plate having a hydrophilic surface layer and an imaging layer containing a copolymer prepared from isobutylene maleic anhydride. An argon laser is used for imaging, and the unexposed regions are washed away with ethanol. It would be desirable to avoid such wet processing conditions.

EP-A 0 652 483 (Ellis et al) describes lithographic printing plates imageable using IR lasers, and which do not require wet processing. These plates comprises an imaging layer that becomes more hydrophilic upon the imagewise exposure to heat. This coating contains a polymer having pendant groups (such as t-alkyl carboxylates). One problem with such materials is that they may be difficult to manufacture, exhibit poor shelf life, require a photoacid generator for imaging, and are positive-working only.

Thus, the graphic arts industry is seeking alternative means for providing a processless, direct-write, negative-working lithographic printing plate that can be imaged without ablation and the accompanying problems noted above. It would also be desirable to use "switchable" polymers without the need for processing after imaging, to render an imaging surface more hydrophobic in exposed areas, yet more hydrophilic in unexposed areas.

SUMMARY OF THE INVENTION

The problems noted above are overcome with an imaging member comprising a support having thereon a surface imaging layer comprising a heat-sensitive polymer, the heat-sensitive polymer having a molecular weight of at least 5000, and comprising recurring units represented by Structure I, II or III below, or combinations thereof:

I

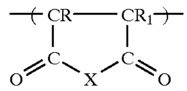

II

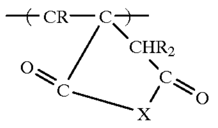

III

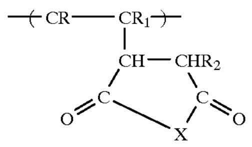

wherein X is oxy or thio, and R, $R_1$ and $R_2$ are independently hydrogen, or an alkyl group of 1 to 3 carbon atoms.

This invention also includes a method of imaging comprising the steps of:

A) providing the imaging member described above, and

B) imagewise exposing the imaging member to thermal energy to provide exposed and unexposed areas in the imaging layer of the imaging member, whereby the exposed areas are rendered more hydrophobic than the unexposed areas.

Preferably, the method is carried further with the step of:

C) contacting the imagewise exposed imaging member with a neutral or acidic pH solution to render the unexposed areas more hydrophilic.

Still further, a method of printing comprises the steps of carrying out steps A, B and C noted above, and additionally:

D) contacting the imaging member with a lithographic printing ink, and imagewise transferring the ink to a receiving material.

The negative-working imaging member of this invention has a number of advantages, thereby avoiding the problems of previous printing plates. Specifically, the problems and concerns associated with ablation imaging (that is, imagewise removal of surface layer) are avoided because the surface characteristics of the imaging layer is changed imagewise by irreversibly "switching" both exposed and unexposed areas of its printing surface. A heat-sensitive imaging polymer in the imaging layer is rendered more hydrophobic upon exposure to thermal energy (such as from IR laser irradiation), and the unexposed areas are rendered more hydrophilic by contact with a neutral or acidic fountain solution.

These advantages are achieved by using a heat-sensitive polymer having a cyclic anhydride type group either within the polymer backbone or as a pendant group. By "cyclic anhydride type" group is meant conventional 5-membered anhydride groups containing oxygen atoms in the ring, as well as the equivalent sulfur-containing groups. Such groups are described in more detail below. The polymers used in the imaging layer are generally inexpensive or readily prepared using known procedures. Thus, the imaging members of this invention are simple to make and use without the need for post-imaging processing (for example, conventional post-heat treatment or alkaline developer treatment).

DETAILED DESCRIPTION OF THE INVENTION

In the lithographic art, materials that release or repel water are considered herein as having "hydrophobic" character. Water accepting materials are considered "hydrophilic" materials.

The imaging member of this invention comprises a support and at least one layer thereon that is heat-sensitive. The support can be any self supporting material including polymeric films, glass, ceramics, metals or stiff papers, or a lamination of any of these three materials. The thickness of the support can be varied. In most applications, the thickness should be sufficient to sustain the wear from printing and thin enough to wrap around a printing form. A preferred embodiment uses a polyester support prepared from, for example, polyethylene terephthalate or polyethylene naphthalate, and has a thickness of from about 100 to about 310 $\mu$m. Another preferred embodiment uses an aluminum sheet having a thickness of from about 100 to about 600 $\mu$m. The support should resist dimensional change under conditions of use.

The support may be coated with one or more "subbing" layers to improve adhesion of the final assemblage. Examples of subbing layer materials include, but are not limited to, adhesion promoting materials such as alkoxysilanes, aminopropyltriethoxysilane, glycidoxypropyltriethoxysilane, epoxy functional polymers and ceramics, as well as conventional subbing layer materials used on polyester supports in photographic films.

The back side of the support may be coated with antistatic agents and/or slipping layers or matte layers to improve handling and "feel" of the imaging member.

The imaging member, however, has only one layer that is required for imaging. This surface layer includes one or more heat-sensitive polymers, and preferably a photothermal conversion material (described below), and provides the outer printing surface of the imaging member. Because of the particular polymer(s) used in the imaging layer, the heat exposed (imaged) areas of the layer are rendered more hydrophobic in nature. The background (unexposed) areas can be then rendered more hydrophilic upon contact with an acidic or neutral pH solution, such as water or a conventional acidic fountain solution.

The heat-sensitive polymers useful in this invention have a molecular weight of at least 5000, and preferably at least 8000. The polymers are vinyl homopolymers or copolymers and are prepared from one or more ethylenically unsaturated polymerizable monomers that are reacted together using known polymerization techniques. In all of the heat-sensitive polymers, at least 25 mol % of the total recurring units have a 5-membered anhydride ring in the backbone or pendant thereto. The anhydride ring opens upon exposure to heat, releasing a gas ($CO_2$ or COS) and forming an unsaturated aldehyde polymer that is hydrophobic. The unexposed polymer reacts with water to form a hydrophilic diacid polymer. The reaction sequences are illustrated as follows with preferred ethylene-maleic anhydride copolymer repeating units:

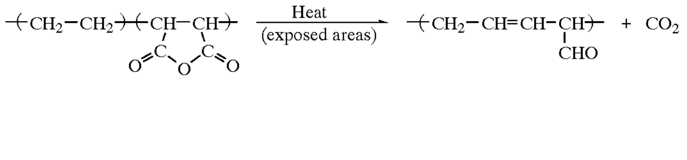

-continued

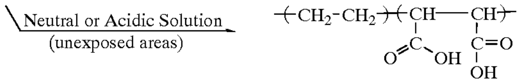

The requisite cyclic recurring units can be generally represented by the following Structures I, II and III:

I

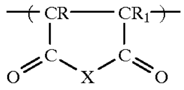

II

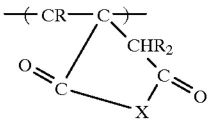

III

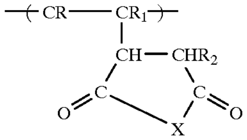

wherein X is oxy or thio (preferably oxy), and R, $R_1$ and $R_2$ are independently hydrogen, or a substituted or unsubstituted alkyl group of 1 to 3 carbon atoms (preferably 1 carbon atom). Such alkyl groups include, but are not limited to, methyl, ethyl, n-propyl, isopropyl, methoxymethyl, ethoxy and chloromethyl. Preferably, each of R, $R_1$ and $R_2$ is independently hydrogen or unsubstituted methyl, and more preferably each is hydrogen.

Preferably, the polymers used in the imaging members of this invention have recurring units represented by Structure I wherein X is oxy or thio, and R and $R_1$ are independently hydrogen or methyl. More preferably, X is oxy and each of R and $R_1$ is hydrogen in such recurring units. The most preferred recurring units are derived from maleic anhydride.

Thus, the heat-sensitive polymers are polymers having from about 25 to about 75 mol %, preferably from about 40 to about 70 mol %, and more preferably from about 40 to about 60 mol %, of the total recurring units being those represented by Structures I, II or III or any combination thereof.

Useful heat-sensitive polymers can include a mixture of two or more of the noted recurring units. Thus, they can be copolymers derived from monomers that provide two or more of the noted recurring units. Alternatively, the imaging layer can include a blend (or mixture) of two or more homo- or copolymers composed exclusively of the noted recurring units.

More preferably, the heat-sensitive polymers are copolymers of one or more monomers providing the recurring units of Structures I, II or III (or combinations thereof), and one or more additional ethylenically unsaturated polymerizable monomers that provide different recurring units. In addition, the imaging layer can include blends (or mixtures) of two or more of such copolymers, or a blend (or mixture) of one or more of such copolymers with one or more homo- or copolymers as described above having exclusively recurring units of Structures I, II or III (or combinations thereof).

The polymerizable monomers useful for copolymerization with monomers from which the Structures I, II and III are derived, can be any additional ethylenically unsaturated monomer having at least one free hydrogen on the carbon atom that becomes directly attached to the recurring unit of Structure I, II or III during polymerization. Representative useful monomers include, but are not limited to, vinyl alkyl ethers, styrenes, vinyl acetate, ethylene, propylene, 1,3-butadiene, and isobutylene. Preferably, such monomers have two hydrogens attached to the carbon that becomes directly attached to the recurring unit of Structure I, II or III. However, if one of those hydrogen atoms is replaced with a substituent, that substituent preferably has no more than 6 carbon atoms, and more preferably, it has no more than 3 carbon atoms, so as to limit the oleophilicity contributed to the copolymer by that monomer. Various substituents include, but are not limited to, methyl, ethyl, isopropyl, acetyl, ethenyl, acetoxy, methoxy, ethoxy and styrene. More than one additional monomer can be copolymerized and incorporated into the copolymer.

Particularly useful monomers include, but are not limited to, ethylene, 1,3-butadiene, vinyl acetate, styrene, vinyl methyl ether and vinyl ethyl ether or any combination thereof. Ethylene, 1,3-butadiene and vinyl acetate are more preferred, and ethylene is most preferred. Thus, a most preferred copolymer is derived from maleic anhydride and ethylene, in a substantially equimolar basis (from about 40 to about 60 mol % of maleic anhydride).

The imaging layer of the imaging member can include one or more of such homopolymers or copolymers, with or without minor (less than 20 weight % based on total dry weight) amounts of additional binder or polymeric materials that will not adversely affect imaging properties of the heat-sensitive layer.

The amount of heat-sensitive polymer(s) used in the heat-sensitive layer is generally at least 0.8 $g/m^2$, and preferably from about 1 to about 1.5 $g/m^2$ (dry weight). This generally provides an average dry thickness of from about 0.8 to about 1.5 $\mu$m. Greater amounts can be used if desired.

The polymers useful in this invention are readily prepared using known addition polymerization techniques and chemistry described in a number of polymer chemistry texts, or purchased from a number of commercial sources (such as Polysciences, Aldrich Chemical or Zeeland Chemicals).

The imaging layer can also include one or more conventional surfactants for coatability or other properties, or dyes or colorants to allow visualization of the written image, or any other addenda commonly used in the lithographic art, as long as the concentrations are low enough so that there is no significant interference with the imaging properties or the ability of the layer to hold water and to repel ink.

The imaging layer preferably also includes one or more photothermal conversion materials to absorb appropriate radiation from an appropriate source of thermal energy, such as an IR radiation emitting laser. Thus, such materials convert photons into heat phonons. Preferably, the thermal energy absorbed is in the infrared and near-infrared regions of the electromagnetic spectrum.

Such photothermal conversion materials can be dyes, pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{2.9}$ component, are also useful. One particularly useful pigment is carbon of some form (for example, carbon black). The size of the pigment particles should not be more than the thickness of the layer. Preferably, the size of the particles will be half the thickness of the layer or less. Useful absorbing dyes for near infrared diode laser beams are described, for example, in U.S. Pat. No. 4,737,486 (Henzel), U.S. Pat. No. 4,973,572 (DeBoer), both incorporated herein by reference. Particular dyes of interest are "broad band" dyes, that is those that absorb over a wide band of the spectrum. Mixtures of pigments, dyes, or both, can also be used. Particularly useful infrared radiation absorbing dyes include bis(dichlorobenzene-1,2-dithiol)nickel(2:1) tetrabutyl ammonium chloride, tetrachlorophthalocyanine aluminum chloride, as well as those illustrated as follows:

IR Dye 1

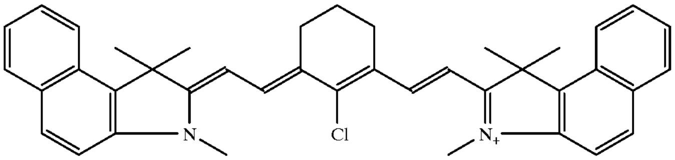

p-Toluenesulfonate

IR Dye 2

Same as Dye 1 but with $C_3F_7CO_2^-$ as the anion

IR Dye 3

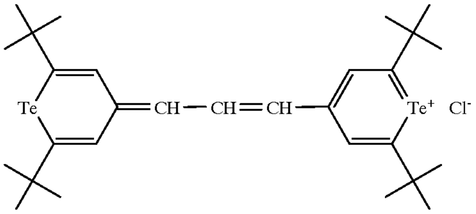

IR Dye 4

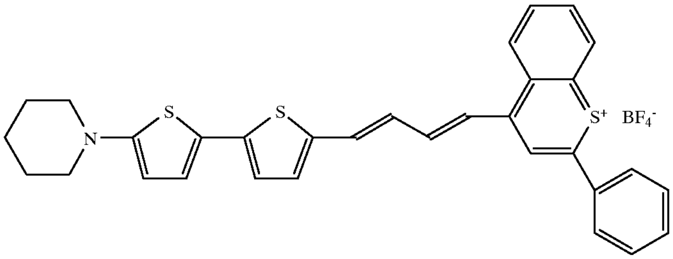

IR Dye 5

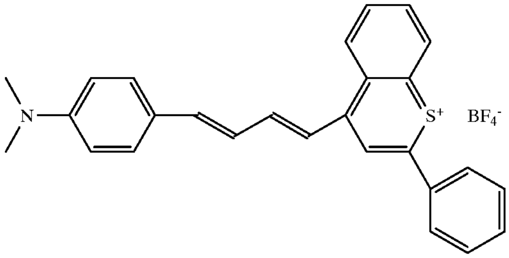

IR Dye 6

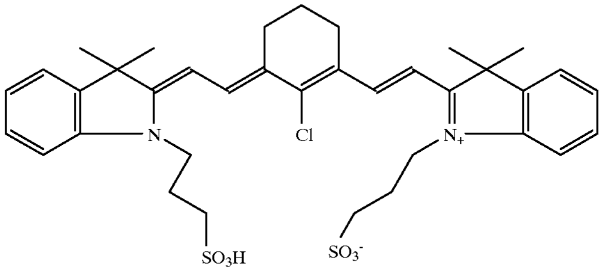

The photothermal conversion material(s) are generally present in an amount sufficient to provide an optical density of at least 0.5, and preferably at least 1.0. The particular amount needed for this purpose would be readily apparent to one skilled in the art, depending upon the specific material used.

The heat-sensitive layer is coated onto the support using any suitable equipment and procedure, such as spin coating, knife coating, gravure coating, dip coating or extrusion hopper coating.

The imaging members of this invention can be of any useful form including, but not limited to, printing plates, printing cylinders, printing sleeves and printing tapes (including flexible printing webs). Preferably, the imaging members are printing plates.

Printing plates can be of any useful size and shape (for example, square or rectangular) having the requisite heat-sensitive layer disposed on a suitable support. Printing cylinders and sleeves are rotary printing members having the support and heat-sensitive layer in a cylindrical form. Hollow or solid metal cores can be used as substrates for printing sleeves.

During use, the imaging member of this invention is exposed to a suitable source of thermal energy, such as a thermoresistive head (or thermal head) or a focused laser beam, in the imaged areas where ink is desired in the printed image, typically from digital information supplied to the imaging device. No heating, wet processing with alkaline developer, or mechanical or solvent cleaning is needed before the printing operation (although wiping or cleaning can be used if desired). A laser used to expose the imaging member of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art. Specifications for lasers that emit in the near-IR region, and suitable imaging configurations and devices are described in U.S. Pat. No. 5,339,737 (Lewis et al), incorporated herein by reference. The laser typically emits in the region of maximum responsiveness in the imaging member, that is where the $\lambda_{max}$ closely approximates the wavelength where the imaging member absorbs most strongly.

The imaging apparatus can operate on its own, functioning solely as a platemaker, or it can be incorporated directly into a lithographic printing press. In the latter case, printing may commence immediately after imaging, thereby reducing press set-up time considerably. The imaging apparatus can be configured as a flatbed recorder or as a drum recorder, with the imaging member mounted to the interior or exterior cylindrical surface of the drum.

In the drum configuration, the requisite relative motion between the laser beam and the imaging member can be achieved by rotating the drum (and the imaging member mounted thereon) about its axis, and moving the laser beam parallel to the rotation axis, thereby scanning the imaging member circumferentially so the image "grows" in the axial direction. Alternatively, the beam can be moved parallel to the drum axis and, after each pass across the imaging member, increment angularly so that the image "grows" circumferentially. In both cases, after a complete scan by the laser beam, an image corresponding (positively or negatively) to the original document or picture can be applied to the surface of the imaging member.

In the flatbed configuration, the laser beam is drawn across either axis of the imaging member, and is indexed along the other axis after each pass. Obviously, the requisite relative motion can be produced by moving the imaging member rather than the laser beam.

Regardless of the manner in which the laser beam is scanned, it is generally preferable (for on-press uses) to employ a plurality of lasers and to guide their outputs to a single writing array. This array is then indexed, after completion of each pass across or along the imaging member, a distance determined by the number of beams emanating from the array, and by the desired resolution (that is, the number of image points per unit length). Off-press applications, which can be designed to accommodate very rapid plate movement and thereby utilize high laser pulse rates, can frequently utilize a single laser as an imaging source.

Although laser imaging is preferred, thermal energy can be supplied using a thermal printing head (or thermal head or thermoresistive head), as described for example, in U.S. Pat. No. 5,488,025 (Martin et al). Useful thermal heads are commercially available, for example as Fujitsu Therma Head FTP-040 MCS001 or TDK Thermal Head F415 HH7-1089.

Once the imaging member has been imaged, it is contacted with a suitable neutral or acidic aqueous solution to render the background (unexposed) areas more hydrophilic. Such a solution generally has a pH of 7 or less, and preferably a pH of from about 4 to about 6. Conventional fountain solutions used in lithographic printing are acceptable for this purpose. Contact with the acidic or neutral solution can occur before or during the printing operation.

Without the need for conventional wet processing or post-imaging heating, printing can then be carried out by applying a lithographic ink to the image on its surface, with a fountain solution, and then transferring the ink to a suitable receiving material (such as cloth, paper, metal, glass or plastic) to provide a desired impression of the image thereon. The imaging members can be cleaned between impressions, if desired, using conventional cleaning means.

The following examples illustrate the practice of the invention, and are not meant to limit it in any way. In these examples, a thermal IR-lathe type printer was used to image the printing plates, the printer being similar to that described in U.S. Pat. No. 5,168,288 (Baek et al), incorporated herein by reference. The printing plates were exposed using approximately 450 mW per channel, 9 channels per swath, 945 lines/cm, a drum circumference of 53 cm and an image spot (1/e2) at the image plane of about 25 $\mu$m. The test image included text, positive and negative lines, half tone dot patterns and a half-tone image. Images were printed at speeds up to 1100 revolutions per minute (the exposure levels do not necessarily correspond to the optimum exposure levels for the tested printing plates).

EXAMPLES 1–3

Imaging Members Having Various Supports

A heat-sensitive imaging formulation was prepared from the following components:

| | |
|---|---|
| Poly(ethylene-co-maleic anhydride) (PEMA) | 0.2 g |
| IR Dye 1 | 0.02 g |
| Acetone | 5 g |

PEMA was obtained from Polysciences as a white powder and analyzed by infrared to contain at least 50% maleic anhydride repeating units. This formulation contained 4.21 weight % solids. It was coated at 100 mg/ft$^2$ (1.08 g/m$^2$) on various support materials shown in TABLE I below and dried in a convection oven at 82° C. for 3 minutes.

The resulting printing plates were clamped onto a rotating drum of an image setting machine and were digitally exposed to an 830 nm laser printhead at dosages ranging from 300 to 660 mJ/$cm^2$. The blue-green coatings bleached rapidly to orange-tan color in the exposed regions. When contacted with a stream of tap water and a black lithographic printing ink, the images were seen to readily accept the ink while the non-exposed regions remained wet with water and free of ink.

A sample of each of the exposed printing plates was also mounted on the plate cylinder of a full page A.B. Dick lithographic duplicator machine and used to print images on paper sheets. Each plate rolled up fast and printed with full density with very clean background for several thousand sheets, without any sign of plate wear. The test results (# of acceptable printed sheets) are also shown in TABLE I below.

TABLE I

| EXAMPLE | SUPPORT MATERIAL | PRESS RUN RESULTS |
|---|---|---|
| 1 | Polyethylene terephthalate (0.01 cm in thickness) | 2000 |
| 2 | Aluminum* (0.02 cm in thickness) | 2000 |
| 3 | Aluminum** (0.02 cm in thickness) | 1000 |

*Support was electrochemically grained and anodized Al post-treated with sodium silicate.
**Support was electrochemically grained and anodized Al post-treated with poly(vinyl phosphonic acid-co-acrylamide)(80:20 weight ratio).

EXAMPLES 4–8

Use of Various IR Radiation Absorbing Materials

These examples demonstrate that various photothermal conversion materials can be used in the imaging members of this invention.

Several heat-sensitive imaging formulations were prepared and coated on an aluminum support as described in Example 3 above, except that various IR radiation absorbing dyes and carbon black were used as photothermal conversion materials. Each resulting printing plate was imaged and evaluated as described in Examples 1–3. The results, summarized in TABLE II below, indicate that fair to excellent photospeed was achieved with the photothermal conversion materials. The photospeed data were estimated based on the ink/water test described in Examples 1–3.

TABLE II

| EXAMPLE | DYE/PIGMENT | $\nu_{max}$ (nm) | PHOTOSPEED |
|---|---|---|---|
| 4 | IR Dye 2 | 830 | Excellent |
| 5 | IR Dye 3 | 830 | Excellent |
| 6 | IR Dye 4 | 936 | Fair |
| 7 | IR Dye 5 | 830 | Good |
| 8 | Carbon black | — | Good |

EXAMPLES 9–15

Use of Various Heat-Sensitive Polymers

These demonstrate the usefulness of various heat-sensitive copolymers or blend of polymers in the imaging layer of printing plates of this invention. Imaging formulations containing various heat-sensitive polymers or blends were prepared and coating on aluminum supports as described in Example 3 above. The resulting printing plates were imagewise exposed, used for printing and evaluated as described in Examples 1–3 above. The results, shown in TABLE III below, indicate that the copolymers within the scope of this invention provided fair to excellent results. The results using the copolymer of Example 11 was not optimum, but showed some "blinding" due to too much hydrophilicity in the imaged areas. However, when that copolymer was blended with the more hydrophobic copolymer of Example 13, the imaging results were improved (Example 14). The copolymer in Example 13, when used alone, exhibited some toning due to hydrophobicity in the background areas. The Control printing plate exhibited severe toning due to unacceptably high hydrophobicity. These results indicate that while some copolymers are too hydrophobic or too hydrophilic to be used alone in the invention, when blended with other suitable polymers, their properties may be moderated such that acceptable printing results are obtained (that is, at least fair image discrimination).

TABLE III

| PLATE | COPOLYMER | RESULTS |
|---|---|---|
| Example 3 | Poly(ethylene-co-maleic anhydride) (50:50) | Excellent |
| Example 9 | Poly(vinyl acetate-co-maleic anhydride) (50:50) | Good |
| Example 10 | Poly(1,3-butadiene-co-maleic anhydride) (50:50) | Fair |
| Example 11 | Poly(vinyl methyl ether-co-maleic anhydride) (50:50) | Some "blinding" |
| Example 12 | Poly(vinyl ethyl ether-co-maleic anhydride) (50:50) | Some toning |
| Example 13 | Poly(styrene-co-maleic anhydride) (50:50) | Some toning |
| Example 14 | Blend of Examples 11 and 13 copolymers (50:50 by weight) | Fair |
| Control | Poly(octadiene-co-maleic anhydride) | Severe toning |

EXAMPLES 16–18

Imaging Members and Use of a Thermal Print Head for Imaging

These examples demonstrate that the heat-sensitive polymers described herein can be used to prepare imaging members that can be imaged without the presence of a photothermal conversion material. However, various dyes including IR absorbing dyes can be used in such imaging members for visualizing the polymer coatings if desired.

Various heat-sensitive polymers (shown below in TABLE IV) were coated out of acetone as described in Example 1 onto a polyethylene terephthalate film support (0.1 mm in thickness). The imaging layers contained no IR absorbing dyes. After drying, the resulting printing plates were imaged using a TDK Thermal Head L-23 1 printhead using a head load of 2.5 kg. This thermal head has 512 independently addressable heating elements each with a resolution of 5.4 dots/mm and an average resistance of 501 ohms. The imaged printing plates were then used to successfully produce several hundred printed sheets as described in Example 1.

TABLE IV

| EXAMPLE | HEAT-SENSITIVE POLYMER | NUMBER OF PRINTED SHEETS |
|---|---|---|
| 16 | Poly(ethylene-co-maleic anhydride) (50:50, Daljac Chemicals) | 400 |
| 17 | Poly(ethylene-co-maleic anhydride (50:50, Aldrich Chemicals) | several hundred |

TABLE IV-continued

| EXAMPLE | HEAT-SENSITIVE POLYMER | NUMBER OF PRINTED SHEETS |
|---|---|---|
| 18 | Poly(vinyl methyl ether-co-maleic anhydride) (50:50, Aldrich Chemicals) | several hundred |

The invention has been described in detail with particular reference to preferred embodiments thereof, but it will be understood that variations and modifications can be effected within the spirit and scope of the invention.

I claim:

1. A method of forming an image using an imaging member comprising a surface imaging layer, the method comprising the steps of:

(A) imagewise exposing the imaging member with thermal energy and forming an exposed imaging member comprising exposed and unexposed areas in the imaging layer;

(B) contacting the exposed imaging member with a neutral or acidic aqueous solution, whereby the unexposed areas are rendered more hydrophilic;

(C) contacting the exposed imaging member with a lithographic ink, whereby the unexposed regions remain free of ink; and (D) imagewise transferring the ink to a receiving material; in which:

the imaging member comprises:

(a) a support; and (b) the surface imaging layer;

the surface imaging layer comprises a heat-sensitive polymer, the heat-sensitive polymer comprising recurring units and a polymer backbone;

the heat-sensitive polymer comprises a 5-membered cyclic anhydride group either within the polymer backbone or as a pendent group;

at least 25 mol % of the total recurring units are the 5-membered cyclic anhydride group; and the heat-sensitive polymer has a molecular weight of at least 5,000.

2. The method of claim 1 in which there is no additional wet processing after step (A).

3. The method of claim 2 in which the aqueous solution has a pH of about 4 to about 6.

4. The method of claim 3 in which the aqueous solution is a fountain solution.

5. The method of claim 1 in which the source of thermal energy is a thermoresistive head.

6. The method of claim 1 in which the 5-membered cyclic anhydride group is:

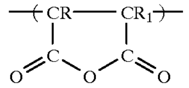

in which:

R and $R_1$ are each independently hydrogen or an alkyl group of 1 to 3 carbon atoms, and about 25 to 75 mol % of the total recurring units are the 5-membered cyclic anhydride group.

7. The method of claim 6 in which R and $R_1$ are each hydrogen.

8. The method of claim 7 in which the heat-sensitive polymer is a copolymer comprising the 5-membered cyclic anhydride group and an ethylenically unsaturated polymerizable monomer comprising at least one free hydrogen atom on the carbon atom attached to the 5-membered cyclic anhydride group.

9. The method of claim 8 in which the heat-sensitive polymer is a copolymer of maleic anhydride with a monomer selected from the group consisting of ethylene, 1,3-butadiene, vinyl acetate, propylene, isobutylene, styrene, vinyl methyl ether, vinyl ethyl ether, and combinations thereof.

10. The method of claim 9 in which the imaging layer comprises a mixture of the heat-sensitive polymers.

11. The method of claim 9 in which the heat-sensitive polymer is a copolymer of maleic anhydride with ethylene, and the copolymer comprises about 40 to about 60 mol % of maleic anhydride.

12. The method of claim 9 in which there is no additional wet processing after step (A).

13. The method of claim 12 in which the aqueous solution has a pH of about 4 to about 6.

14. The method of claim 13 in which the aqueous solution is a fountain solution.

15. The method of claim 9 in which the source of thermal energy is a thermoresistive head.

16. The method of claim 1 in which the imaging layer additionally comprises a photothermal conversion material.

17. The method of claim 16 in which there is no additional wet processing after step (A).

18. The method of claim 17 in which the aqueous solution has a pH of about 4 to about 6.

19. The method of claim 18 in which the aqueous solution is a fountain solution.

20. The method of claim 16 in which the source of thermal energy is a focused laser beam.

21. The method of claim 16 in which the 5-membered cyclic anhydride group is:

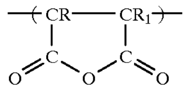

in which:

R and $R_1$ are each independently hydrogen or an alkyl group of 1 to 3 carbon atoms, and about 25 to 75 mol % of the total recurring units are the 5-membered cyclic anhydride group.

22. The method of claim 21 in which R and $R_1$ are each hydrogen.

23. The method of claim 22 in which the heat-sensitive polymer is a copolymer comprising the 5-membered cyclic anhydride group and an ethylenically unsaturated polymerizable monomer comprising at least one free hydrogen atom on the carbon atom attached to the 5-membered cyclic anhydride group.

24. The method of claim 23 in which the heat-sensitive polymer is a copolymer of maleic anhydride with a monomer selected from the group consisting of ethylene, 1,3-butadiene, vinyl acetate, propylene, isobutylene, styrene, vinyl methyl ether, vinyl ethyl ether, and combinations thereof.

25. The method of claim 24 in which the imaging layer comprises a mixture of the heat-sensitive polymers.

26. The method of claim 24 in which the heat-sensitive polymer is a copolymer of maleic anhydride with ethylene, and the copolymer comprises about 40 to about 60 mol % of maleic anhydride.

27. The method of claim 24 in which there is no additional wet processing after step (A).

28. The method of claim 27 in which the aqueous solution has a pH of about 4 to about 6.

29. The method of claim 28 in which the photothermal conversion material is selected from the group consisting of carbon black,
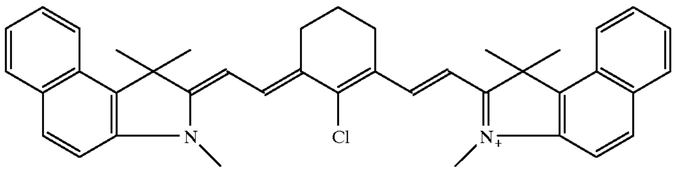
,
p-Toluenesulfonate
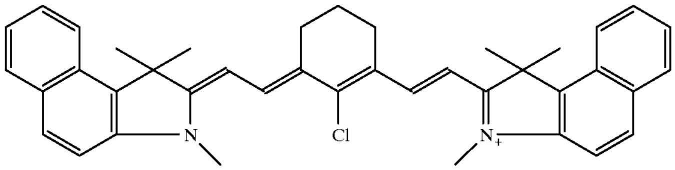
,
$C_3F_7CO_2$—
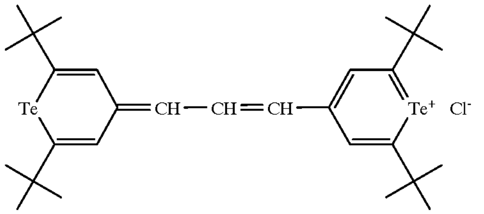
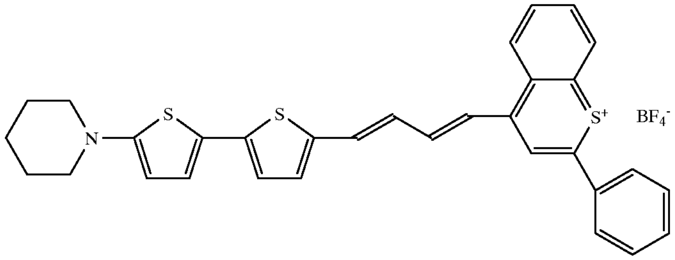
, and
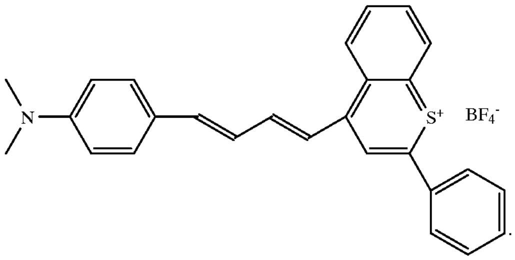
.
30. The method of claim 24 in which the source of thermal energy is a focused laser beam.
* * * * *